United States Patent
Wachi et al.

(10) Patent No.: US 7,314,518 B2
(45) Date of Patent: Jan. 1, 2008

(54) FURNACE FOR GROWING COMPOUND SEMICONDUCTOR SINGLE CRYSTAL AND METHOD OF GROWING THE SAME BY USING THE FURNACE

(75) Inventors: Michinori Wachi, Hitachi (JP); Hiroshi Sasabe, Hitachi (JP); Shunsuke Yamamoto, Hitachi (JP)

(73) Assignee: Hitachi Cable, Ltd., Tokyo (JP)

(*) Notice: Subject to any disclaimer, the term of this patent is extended or adjusted under 35 U.S.C. 154(b) by 300 days.

(21) Appl. No.: 11/033,986

(22) Filed: Jan. 13, 2005

(65) Prior Publication Data

US 2005/0223971 A1   Oct. 13, 2005

(30) Foreign Application Priority Data

Apr. 9, 2004 (JP) ............................. 2004-115440

(51) Int. Cl.
*C30B 11/04* (2006.01)

(52) U.S. Cl. ........................................... 117/81; 117/83

(58) Field of Classification Search .................. 117/81, 117/83
See application file for complete search history.

(56) References Cited

U.S. PATENT DOCUMENTS 6,334,897 B1 * 1/2002 Asahi et al. .................. 117/81

FOREIGN PATENT DOCUMENTS

| JP | 5-194073 A | 8/1993 |
|----|------------|--------|
| JP | 10-87392 A | 4/1998 |

* cited by examiner

*Primary Examiner*—Felisa Hiteshew
(74) *Attorney, Agent, or Firm*—Foley & Lardner LLP

(57) ABSTRACT

A crystal growth furnace for a compound semiconductor single crystal has: a small diameter section for placing a seed crystal therein; an increasing diameter section that has diameters to increase from the small diameter section to upward; and a constant diameter section that extends from the increasing diameter section to upward. The increasing diameter section has an angle of 120 degrees or more and less than 160 degrees between inner walls opposed to each other.

7 Claims, 3 Drawing Sheets

FURNACE FOR GROWING COMPOUND SEMICONDUCTOR SINGLE CRYSTAL AND METHOD OF GROWING THE SAME BY USING THE FURNACE

The present application is based on Japanese patent application No. 2004-115440, the entire contents of which are incorporated herein by reference.

BACKGROUND OF THE INVENTION

1. Field of the Invention

This invention relates to a furnace for growing a compound semiconductor single crystal and a method of growing the compound semiconductor single crystal by using the furnace. Especially, the furnace is suitably used for growing a compound semiconductor single crystal with a zinc blende structure such as gallium arsenide (herein referred to as GaAs), indium phosphide (herein referred to as InP) and gallium phosphide (herein referred to as GaP).

2. Description of the Related Art

One of methods for growing compound semiconductor single crystal such as GaAs and InP is a vertical boat method that a material melt is charged in a growth furnace (crucible), the crystallization starts from a seed crystal previously placed at the bottom of the growth furnace, the crystallization proceeds gradually to upward, and finally the whole material melt is crystallized. The vertical boat method includes a vertical Bridgman (VB) method that a crystal is grown by moving a crucible from a high temperature section to a low temperature section in a hot zone with an adjusted temperature profile, and a vertical gradient freeze (VGF) method that a crystal is grown by gradually lowering the furnace temperature while the temperature gradient remains stable. It is generally known that the vertical boat method can offer a compound semiconductor single crystal with reduced crystal defect such as a dislocation since the crystal growth is conducted in a temperature gradient smaller than the Czochralski pull method.

FIG. 1A is a vertical cross sectional view showing a conventional single crystal growth furnace 101 used for the vertical boat method. FIG. 1B is a cross sectional view cut along a line A-A' in FIG. 1A.

The crystal growth furnace 101 is generally composed of: a small diameter section 100a that is at the bottom formed like a well and serves as a seed crystal charge region; an increasing diameter section 101b that is formed like an inverted truncated cone tube and has diameters increased from the small diameter section 101a to upward; and a constant diameter section 101c that is formed cylindrical and has a nearly constant diameter and serves as a crystal growth region lying from the increasing diameter section 101b to upward.

It is known that there is a close relationship between the an angle (a) of inner wall in the increasing diameter section 101b and a probability of twin crystal generation when a zinc blende structure compound semiconductor single crystal such as gallium arsenide is grown using such a crystal growth furnace by the vertical boat method.

It is known that a GaAs single crystal etc. is grown in the (100) direction and, therefore, a (111) facet is generated in the increasing diameter section 101b and a twin crystal is generated from the facet. Since an angle formed between the (100) plane and the (111) plane is 54.7 degrees, the angle (a) of inner wall in the increasing diameter section 101b as shown in FIG. 1A is generally set to be 70.6 degrees (=180 degrees−54.7 degrees×2) or less. However, when the angle (a) of inner wall in the increasing diameter section 101b decreases, the single crystal obtained must have a long crystal portion corresponding to the increasing diameter section 101b. Thereby, the yield of wafer lowers and the production efficiency lowers. Because of this, it is tried that the angle (a) of inner wall in the increasing diameter section 101b is set to be about 80 degrees to 100 degrees. However, in terms of the prevention of twin crystal generation, a sufficient effect is not obtained.

Japanese patent application laid-open No. 5-194073 (prior art 1) discloses a crystal growth method that a crucible used has 160 degrees to 200 degrees in the angle (a) of inner wall in the increasing diameter section, its crystal is grown in a nearly horizontal direction while making locally a region near the seed crystal into a supercooled state, the crystal growth is further conducted such that a boundary surface of solid phase and liquid phase (herein referred to as solid-liquid interface) is convex toward the melt side, and thereafter its material melt is solidified by cooling in a temperature gradient of 5° C./cm to 15° C./cm.

Japanese patent application laid-open No. 10-87392 (prior art 2) discloses a crystal growth method that a crucible used has 160 degrees to 180 degrees in the angle (a) of inner wall in the increasing diameter section, and the temperature gradient in the growth direction of at least the increasing diameter section is controlled to be 1° C./cm to 5° C./cm during the crystallization.

However, it is noted by the inventors that the crystal growth methods of prior arts 1, 2 have problems as described below.

In prior art 1, in order to control the temperature profile to make the solid-liquid interface convex toward the melt side, it is required that the temperature gradient is 5° C./cm or more during the cooling. However, when the temperature gradient is 5° C./cm or more, it is difficult to sufficiently prevent the generation of twin crystal or polycrystal because a large fluctuation in temperature is caused by a convection in the material melt. Further, its heat sink needs to have a cooling medium in order to control the temperature profile. Therefore, the manufacturing cost increases.

In prior art 2, it is required that the crucible used has 160 degrees to 180 degrees in the angle (a) of inner wall in the increasing diameter section, and the temperature gradient in the growth direction of at least the increasing diameter section is controlled to be 1° C./cm to 5° C./cm during the crystallization. However, in the case of controlling to be 160 degrees to 180 degrees in the angle (a) of inner wall in the increasing diameter section and to be 1° C./cm to 5° C./cm in the temperature gradient in the growth direction, it is difficult to control the supercooled state of material melt in the shoulder section. Thus, since the growth of (111) facet is promoted, it is difficult to sufficiently prevent the generation of twin crystals. Furthermore, since the temperature gradient is small and the shoulder angle is large, crystal nuclei may be generated from other than the seed crystal section to have polycrystal.

SUMMARY OF THE INVENTION

It is an object of the invention to provide a crystal growth furnace that can grow, in the vertical boat method, a zinc blende structure compound semiconductor single crystal such as GaAs at a high yield without requiring any additional devices, while preventing the generation of twin crystal or polycrystal in the increasing diameter section.

It is a further object of the invention to provide a method of growing thus the single crystal by using the crystal growth furnace.

According to one aspect of the invention, a crystal growth furnace for a compound semiconductor single crystal comprises:
  a small diameter section for placing a seed crystal therein;
  an increasing diameter section that comprises diameters to increase from the small diameter section to upward; and
  a constant diameter section that extends from the increasing diameter section to upward,
  wherein the increasing diameter section comprises an angle of 120 degrees or more and less than 160 degrees between inner walls opposed to each other.

According to another aspect of the invention, a method of growing a compound semiconductor single crystal comprises the steps of:
  placing a material melt in a crystal growth furnace;
  initially growing a crystal from a seed crystal previously placed at the bottom of the crystal growth furnace; and
  then growing gradually the crystal to extend to upward so as to make the whole material melt crystallized,
  wherein the crystal growth furnace comprises a small diameter section for placing a seed crystal therein, an increasing diameter section that comprises diameters to increase from the small diameter section to upward, and a constant diameter section that extends from the increasing diameter section to upward, wherein the increasing diameter section comprises an angle of 120 degrees or more and less than 160 degrees between inner walls opposed to each other.

It is preferred that the small diameter section comprises a cylindrical form, the constant diameter section comprises a cylindrical form with a nearly constant diameter, and the increasing diameter section that connects the small diameter section and the constant diameter section, and comprises an inverted truncated cone tubular form.

It is preferred that the crystal growth furnace or the method is applied to the compound semiconductor single crystal that comprises a zinc blende structure.

It is preferred that the crystal growth furnace or the method is applied to a vertical boat method.

It is preferred that the crystal growth furnace or the method is applied to a crystal growth in a temperature gradient of 5° C./cm or more and 15° C./cm or less.

ADVANTAGES OF THE INVENTION

In growing a zinc blende structure compound semiconductor single crystal such as GaAs in the vertical boat method, a single crystal is generally grown in the (100) direction. It is known that in this process a (111) facet is generated in the increasing diameter section and a twin crystal is generated from the facet. In general, it is thought that the twin crystal is likely to be generated when the facet is grown deeply in the crystal. Further, it is thought that the depth of the facet somewhat relates to an angle of inner walls opposed to each other in the crystal growth furnace.

The invention is addressed to the crystal growth furnace with the increasing diameter section that comprises an angle of 120 degrees or more and less than 160 degrees between inner walls opposed to each other for growing the compound semiconductor single crystal by the vertical boat method. Thereby, the generation of twin crystal or polycrystal in the increasing diameter section can be prevented.

Thus, in the invention, by the angle of 120 degrees or more and less than 160 degrees between the inner walls opposed to each other, the generation of twin crystal or polycrystal in the increasing diameter section can be prevented without requiring any additional devices in the crystal growth of compound semiconductor single crystal by the VB method or VGF method. Therefore, compound semiconductor single crystals, especially a zinc blende structure compound semiconductor single crystal such as GaAs, InP and GaP, can be produced at a high yield. Furthermore, the manufacturing of the crystal growth furnace is easy since the structure or installation is not complicated. As stated above, the invention can offer major economic effects in terms of industrial production.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1A:
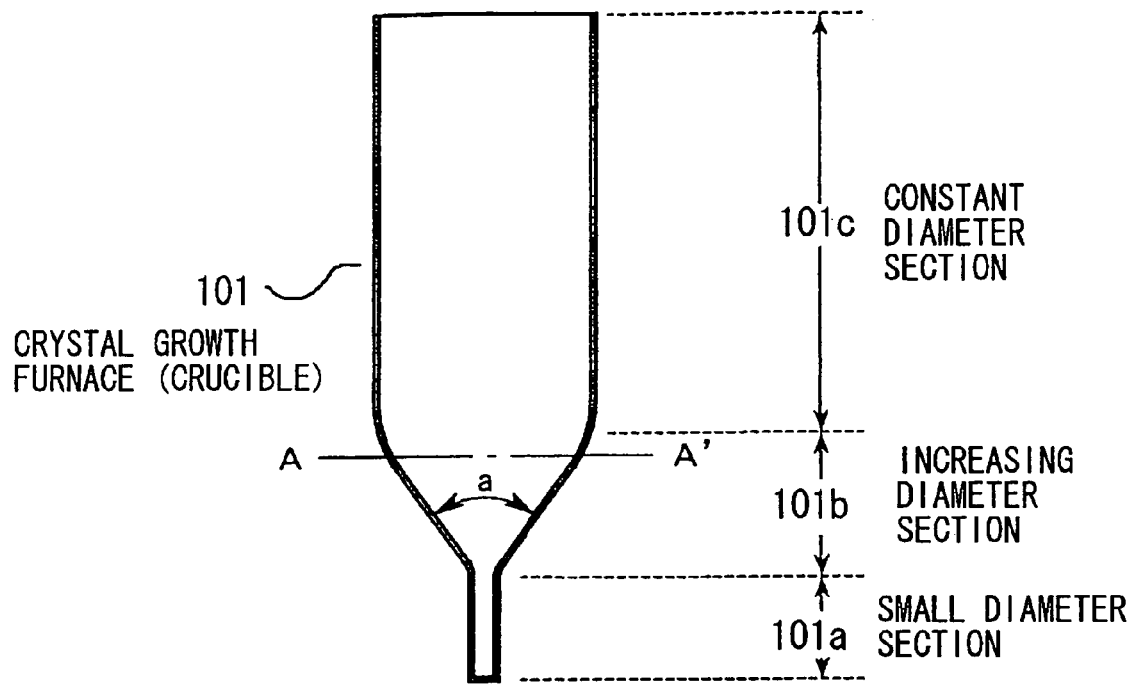
FIG. 1A is a vertical cross sectional view showing the conventional single crystal growth furnace.
Figure 1B:
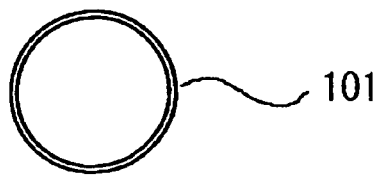
FIG. 1B is a cross sectional view cut along a line A-A' in FIG. 1A.
Figure 2:
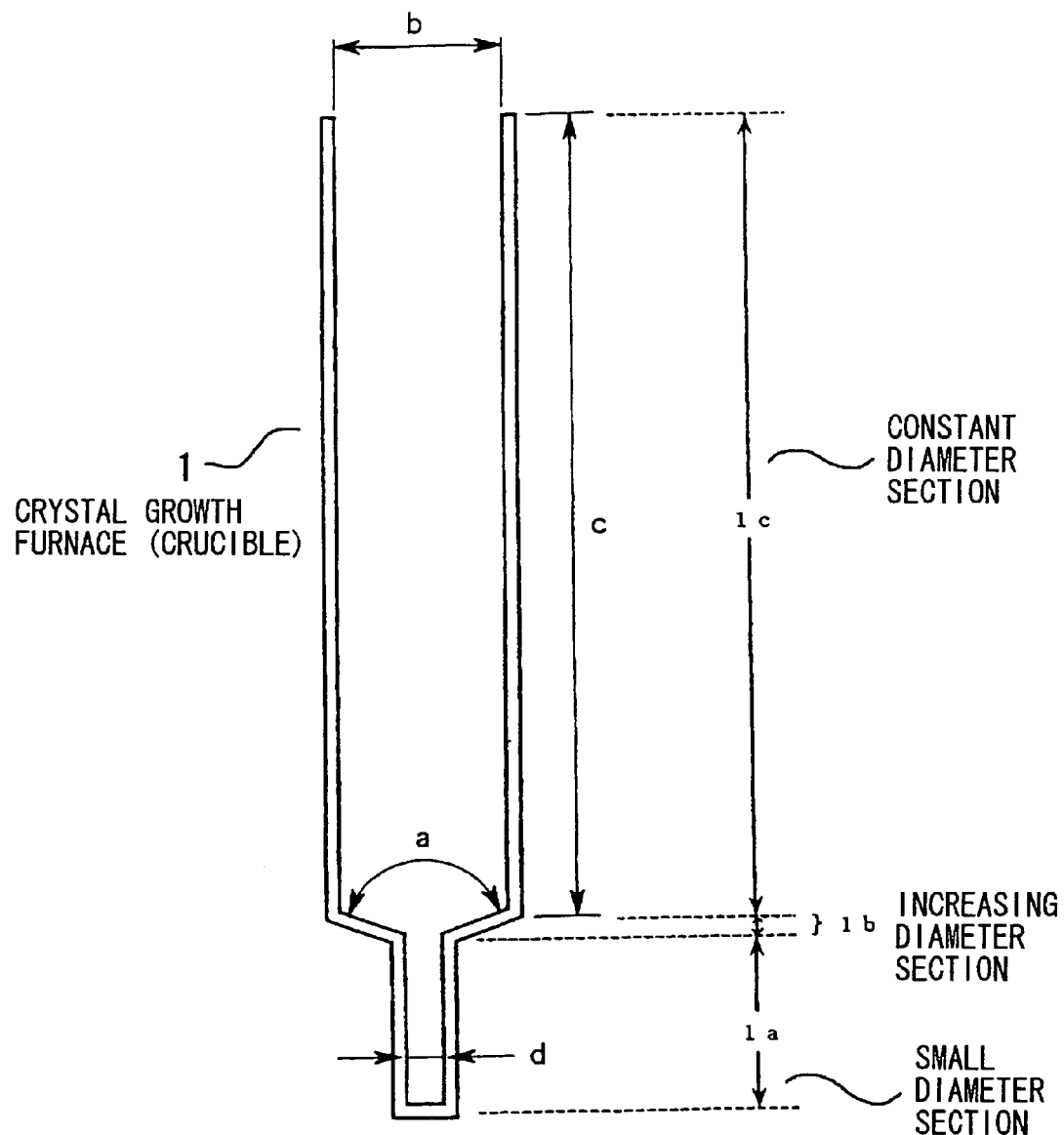
FIG. 2 is a vertical cross sectional view showing a single crystal growth furnace in a preferred embodiment of the invention.

FIG. 2 is a vertical cross sectional view showing a compound semiconductor single crystal growth furnace 1 in the preferred embodiment of the invention.

The crystal growth furnace 1 is made of Pyrolitic Boron Nitride (herein referred to as PBN). Like the conventional crystal growth furnace, the crystal growth furnace 1 is composed of: a small diameter section 1a that is at the bottom formed like a well and serves as a seed crystal charge region; an increasing diameter section 1b that is formed like an inverted truncated cone tube and has diameters increased from the small diameter section 1a to upward; and a constant diameter section 1c that is formed cylindrical and has a nearly constant diameter and serves as a crystal growth region lying from the increasing diameter section 1b to upward. However, different from the conventional crystal growth furnace 101, the crystal growth furnace 1 has the increasing diameter section 1a with an angle (a) of 120 degrees or more and 160 degrees or less.

The crystal growth furnace 1 is used for producing a compound semiconductor single crystal by using the VB method or the VGF method conducted such that material melt is charged therein, the crystal growth starts from a seed crystal previously charged into the bottom thereof, the crystallization gradually proceeds to upward, and finally the whole material melt is crystallized.

The crystal growth furnace 1, without requiring any additional devices, can prevent the generation of twin crystal or polycrystal in the increasing diameter section 1b. Thus, the crystal growth furnace 1 can, at a high yield, produce a zinc blende structure compound semiconductor crystal such as GaAs.

In order to verify the effect of the crystal growth furnace 1 of the invention, GaAs single crystals are grown in the following Example and Comparative Examples.

EXAMPLE

Figure 3:
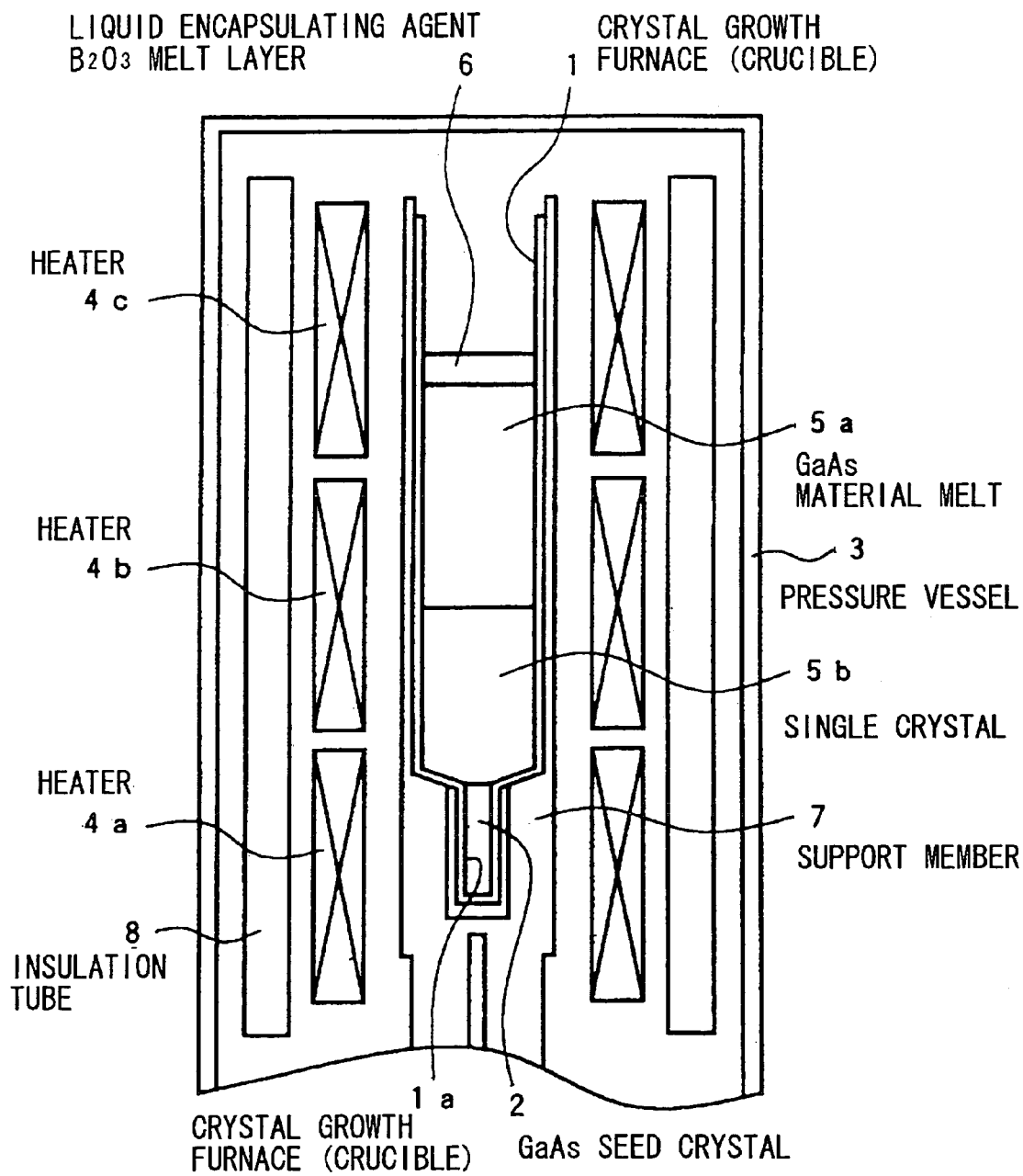
FIG. 3 is a vertical cross sectional view showing a crystal growth apparatus including the single crystal growth furnace of the embodiment.

An Example of the invention will be explained below referring to FIGS. 2 and 3. FIG. 2 is the vertical cross sectional view showing the single crystal growth furnace used in the Example. FIG. 3 is a vertical cross sectional view showing a crystal growth apparatus including the single crystal growth furnace of the Example.

The following Example explained below is the case that GaAs single crystal as one of compound semiconductors is grown. In this Example, the crystal growth furnace 1 is used that its shoulder angle (a) is a=140 degrees, a diameter (b) of the constant diameter section 1c as the crystal growth region is b=80 mm, a length (c) of the constant diameter section 1c is c=300 mm, and a diameter (d) of the small diameter section 1a as the seed crystal region is d=10 mm.

Referring to FIG. 3, at first, a GaAs seed crystal 2 is charged in the small diameter section 1a (seed crystal charge region) at the bottom of the crystal growth furnace 1. Then, a GaAs polycrystalline material of 10,000 g and a boron trioxide (herein referred to as $B_2O_3$) as a liquid encapsulating agent of 500 g are charged in the crystal growth furnace 1 (not shown). Then, the crystal growth furnace 1 is placed in a pressure vessel 3 and the inner atmosphere of the pressure vessel 3 is replaced by inert gas. Then, by supplying three-stage heaters 4a, 4b and 4c disposed vertically with electric power, the GaAs polycrystalline material is melted to provide a GaAs material melt layer 5a and a liquid encapsulating agent $B_2O_3$ melt layer 6 to start the seeding in crystallization. Meanwhile, in FIG. 3, although GaAs single crystal 5b is shown, only the GaAs material melt layer 5a exists at the start of crystallization.

Then, while setting a temperature gradient to be 6° C./cm, by using the vertical Bridgman (VB) method that the crystal growth furnace 1 is dropped at a speed of 5 mm/hr, the GaAs single crystal is grow gradually. Meanwhile, in FIG. 3, 7 is a support member for the crystal growth furnace 1 and 8 is an insulation tube.

By using the above process, the growth of GaAs single crystal is conducted fifty times (fifty samples obtained). As a result, it is found that the ratio of continuous single crystal (herein referred to as All Single) from the seeding point of crystal through the end of grown crystal is 80% or more, the ratio of twin crystal generated in the increasing diameter section 1b is 5% or less, and the ratio of polycrystal generated therein is 3% or less.

Comparative Example 1

The growth of GaAs single crystal is conducted fifty times (fifty samples obtained) such that an angle (a) of inner wall in the increasing diameter section 1b of the crystal growth furnace 1 is a=less than 120 degrees and the other conditions are the same as those of the above Example. As a result, the ratio of All Single is 40% or less, the ratio of twin crystal generated in the increasing diameter section 1b is 15% or less, and the ratio of polycrystal generated therein is 3% or less.

Comparative Example 2

The growth of GaAs single crystal is conducted fifty times (fifty samples obtained) such that an angle (a) of inner wall in the increasing diameter section 1b of the crystal growth furnace 1 is a=160 degrees or more and the other conditions are the same as those of the above Example. As a result, the ratio of All Single is 65% or less, the ratio of twin crystal generated in the increasing diameter section 1b is 5% or less, and the ratio of polycrystal generated therein is 15% or less.

Comparative Example 3

The relationship between a temperature gradient and a ratio of All Single is researched under the condition (condition 1) that an angle (a) of inner wall in the increasing diameter section 1b of the crystal growth furnace 1 is a=120 degrees or more and less than 160 degrees, under the condition (condition 2) that an angle (a) of inner wall in the increasing diameter section 1b is a=less than 120 degrees, and under the condition (condition 3) that an angle (a) of inner wall in the increasing diameter section 1b is a=160 degrees or more.

Although the temperature gradient of the above Example is set to be 6° C./cm, of ratios of All Single obtained under the conditions 1 to 3, where the temperature gradient is varied, a ratio of All Single under the condition 1 (a=120 degrees or more and less than 160 degrees) is always greater than that under the condition 2 (a=less than 120 degrees) and that under the condition 3 (a=160 degrees or more).

Another Example

In the above Example, the crystal growth furnace 1 is used for growing the GaAs single crystal by the vertical Bridgman (VB) method. However, the invention is not limited to this Example. The same effects as the above Example can be also obtained in a case that the crystal growth furnace 1 is used for growing another zinc blende structure compound semiconductor single crystal, such as InP and GaP, by the vertical Bridgman (VB) method. Alternatively, the invention may be applied to the vertical boat method, such as VGF method, other than the VB method.

USE AND APPLICATION

The compound semiconductor single crystal obtained by using the crystal growth furnace of the invention is featured in that the ratio of All Single is greater than that of the conventional methods, and that the crystal defect such as dislocation is significantly less than compound semiconductor single crystals obtained by the conventional methods. This reveals that, in case of the conventional methods, even All Single includes collected dislocations though they does not develop into lineage or semi-grain boundary.

When a device is fabricated by using a compound semiconductor single crystal wafer obtained by the invention, a reduction in device production yield caused by crystal defect such as a dislocation can be prevented. Therefore, the invention can offer major economic effects in terms of industrial production.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A crystal growth furnace for a compound semiconductor single crystal, comprising:
    a small diameter section for placing a seed crystal therein;
    an increasing diameter section comprising a diameter that increases in an upward direction from the small diameter section; and a constant diameter section that extends upwards from the increasing diameter section, wherein the increasing diameter section comprises an angle of 120 degrees or more and less than 160 degrees between inner walls opposed to each other;

wherein the crystal growth furnace drops at a speed of 5 mm/hr;

wherein the compound semiconductor single crystal comprises GaAs.

2. The crystal growth furnace according to claim 1, wherein:

the small diameter section comprises a cylindrical form, the constant diameter section comprises a cylindrical form with a nearly constant diameter, and the increasing diameter section connects the small diameter section and the constant diameter section, and comprises an inverted truncated cone tubular form.

3. The crystal growth furnace according to claim 1, wherein; the crystal growth furnace is configured to grow a compound semiconductor single crystal that comprises a zinc blende structure.

4. The crystal growth furnace according to claim 1, wherein:

the crystal growth furnace is configured to utilize a vertical boat method.

5. The crystal growth furnace according to claim 1, wherein:

the crystal growth furnace is configured to grow a crystal by utilizina a temperature gradient of 5° C./cm or more and 15° C./cm or less.

6. The crystal growth furnace according to claim 1, wherein the drop speed of the crystal growth furnace remains constant.

7. The crystal growth furnace according to claim 1, wherein a diameter of the constant diameter section is 80 mm, a length of the constant diameter section is 300 mm, and a diameter of the small diameter section is 10 mm.

* * * * *

UNITED STATES PATENT AND TRADEMARK OFFICE
CERTIFICATE OF CORRECTION

PATENT NO. : 7,314,518 B2  
APPLICATION NO. : 11/033986  
DATED : January 1, 2008  
INVENTOR(S) : Michinori Wachi, Hiroshi Sasabe and Shunsuke Yamamoto It is certified that error appears in the above-identified patent and that said Letters Patent is hereby corrected as shown below:

IN THE SPECIFICATION
Column 1, line 45, reading "$100a$" should be changed to --$101a$--.
Column 2, line 21, each occurrence, reading "C./cm" should be changed to --C/cm--.
Column 2, line 27, each occurrence, reading "C./cm" should be changed to --C/cm--.
Column 2, line 34, reading "C./cm" should be changed to --C/cm--.
Column 2, line 36, reading "C./cm" should be changed to --C/cm--.
Column 2, line 47, each occurrence, reading "C./cm" should be changed to --C/cm--.
Column 2, line 50, each occurrence, reading "C./cm" should be changed to --C/cm--.
Column 3, line 47, each occurrence, reading "C./cm" should be changed to --C/cm--.
Column 5, line 33, reading "C./cm" should be changed to --C/cm--.
Column 6, line 17, reading "C./cm" should be changed to --C/cm--.

IN THE CLAIMS
Claim 3, line 2, reading ";" should be changed to --:--.
Claim 5, line 4, reading "utilizina" should be changed to --utilizing--.
Claim 5, line 4, reading "C./cm" should be changed to --C/cm--.
Claim 5, line 5, reading "C./cm" should be changed to --C/cm--.

Signed and Sealed this

First Day of July, 2008

JON W. DUDAS  
*Director of the United States Patent and Trademark Office*

UNITED STATES PATENT AND TRADEMARK OFFICE
CERTIFICATE OF CORRECTION

PATENT NO. : 7,314,518 B2 Page 1 of 1
APPLICATION NO. : 11/033986
DATED : January 1, 2008
INVENTOR(S) : Michinori Wachi, Hiroshi Sasabe and Shunsuke Yamamoto It is certified that error appears in the above-identified patent and that said Letters Patent is hereby corrected as shown below:

IN THE SPECIFICATION
Column 1, line 45, reading "$100a$" should be changed to --$101a$--.
Column 2, line 21, each occurrence, reading "C./cm" should be changed to --C/cm--.
Column 2, line 27, each occurrence, reading "C./cm" should be changed to --C/cm--.
Column 2, line 34, reading "C./cm" should be changed to --C/cm--.
Column 2, line 36, reading "C./cm" should be changed to --C/cm--.
Column 2, line 47, each occurrence, reading "C./cm" should be changed to --C/cm--.
Column 2, line 50, each occurrence, reading "C./cm" should be changed to --C/cm--.
Column 3, line 47, each occurrence, reading "C./cm" should be changed to --C/cm--.
Column 5, line 33, reading "C./cm" should be changed to --C/cm--.
Column 6, line 17, reading "C./cm" should be changed to --C/cm--.

IN THE CLAIMS
Column 7, Claim 3, line 19, reading ";" should be changed to --:--.
Column 8, Claim 5, line 9, reading "utilizina" should be changed to --utilizing--.
Column 8, Claim 5, line 9, reading "C./cm" should be changed to --C/cm--.
Column 8, Claim 5, line 10, reading "C./cm" should be changed to --C/cm--.

This certificate supersedes the Certificate of Correction issued July 1, 2008.

Signed and Sealed this

Twenty-second Day of July, 2008

JON W. DUDAS
*Director of the United States Patent and Trademark Office*